(12) United States Patent
Hsu

(10) Patent No.: US 11,289,587 B2
(45) Date of Patent: Mar. 29, 2022

(54) TRENCH POWER SEMICONDUCTOR COMPONENT AND METHOD OF MANUFACTURING THE SAME

(71) Applicant: SUPER GROUP SEMICONDUCTOR CO., LTD., Hsinchu County (TW)

(72) Inventor: Hsiu-Wen Hsu, Hsinchu County (TW)

(73) Assignee: SUPER GROUP SEMICONDUCTOR CO., LTD., Hsinchu County (TW)

( * ) Notice: Subject to any disclaimer, the term of this patent is extended or adjusted under 35 U.S.C. 154(b) by 0 days.

(21) Appl. No.: 16/824,899

(22) Filed: Mar. 20, 2020

(65) Prior Publication Data
US 2020/0343369 A1 Oct. 29, 2020

(30) Foreign Application Priority Data
Apr. 24, 2019 (TW) .................................. 108114372

(51) Int. Cl.
*H01L 29/66* (2006.01)
*H01L 29/78* (2006.01)
*H01L 29/423* (2006.01)

(52) U.S. Cl.
CPC .... *H01L 29/66734* (2013.01); *H01L 29/4236* (2013.01); *H01L 29/7813* (2013.01)

(58) Field of Classification Search
CPC ........... H01L 29/66734; H01L 29/7813; H01L 29/4236; H01L 29/7825; H01L 29/66613; H01L 29/66621; H01L 29/42336; H01L 29/407
See application file for complete search history.

(56) References Cited

U.S. PATENT DOCUMENTS

| | | | | |
|---|---|---|---|---|
| 6,376,315 B1* | 4/2002 | Hshieh | ................ | H01L 29/1095 438/270 |
| 8,497,549 B2* | 7/2013 | Madson | .............. | H01L 29/7813 257/330 |
| 9,653,560 B1* | 5/2017 | Liu | ...................... | H01L 29/4236 |
| 2004/0166619 A1* | 8/2004 | Takemori | ............ | H01L 29/7813 438/197 |
| 2006/0273386 A1* | 12/2006 | Yilmaz | ................ | H01L 29/7827 257/330 |
| 2010/0187602 A1* | 7/2010 | Woolsey | ........... | H01L 21/76202 257/330 |

(Continued)

*Primary Examiner* — Jarrett J Stark
(74) *Attorney, Agent, or Firm* — Li & Cai Intellectual Property (USA) Office

(57) ABSTRACT

A trench power semiconductor component and a method of manufacturing the same are provided. In the method, a step of forming a trench gate structure includes the following steps. First, a shielding electrode, a bottom insulating layer, and an upper insulating layer are formed in a trench. The bottom insulating layer covers a lower part of an inner wall of the trench, and surrounds the shielding electrode. The upper insulating layer covers an upper part of the inner wall. Thereafter, an interlayer dielectric layer and a U-shaped masking layer are formed in the trench. The interlayer dielectric layer is interposed between the upper insulating layer and the U-shaped masking layer. A portion of the upper insulating layer and a portion of the interlayer dielectric layer which are located at an upper part of the trench are removed so as to form an inter-electrode dielectric layer.

11 Claims, 9 Drawing Sheets

(56) References Cited

U.S. PATENT DOCUMENTS

| | | | |
|---|---|---|---|
| 2012/0104490 A1* | 5/2012 | Yilmaz | H01L 29/7806 |
| | | | 257/330 |
| 2015/0008514 A1 | 1/2015 | Chan et al. | |
| 2015/0115357 A1* | 4/2015 | Han | H01L 27/0203 |
| | | | 257/334 |
| 2019/0006489 A1* | 1/2019 | Hsu | H01L 29/407 |
| 2019/0109216 A1* | 4/2019 | Cai | H01L 21/28035 |

* cited by examiner

TRENCH POWER SEMICONDUCTOR COMPONENT AND METHOD OF MANUFACTURING THE SAME

CROSS-REFERENCE TO RELATED PATENT APPLICATION

This application claims the benefit of priority to Taiwan Patent Application No. 108114372, filed on Apr. 24, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power semiconductor component and a method of manufacturing the same, and more particularly to a trench power semiconductor component having a shielding electrode and a method of manufacturing the same.

BACKGROUND OF THE DISCLOSURE

Power loss in a conventional trench power metal oxide semiconductor field transistor (power MOSFET) includes two types: switching loss and conduction loss. The gate-drain capacitance (Cgd) is an important parameter affecting the switching loss. If the gate-drain capacitance is too high, the switching loss increases, and the switching speed of the power MOSFET is further limited, such that the power MOSFET is considered not suitable for high frequency circuits.

The conventional trench power MOSFET has a shielding electrode in the lower half of a gate trench to reduce the gate-drain capacitance and to increase the breakdown voltage without affecting the on-resistance, thereby optimizing the thickness and resistance of an epitaxial layer.

Currently, in the process of forming the trench power MOSFET having the shielding electrode, a gate oxide layer and an inter-electrode dielectric layer between a gate and the shielding electrode are completed in the same thermal oxidation step. That is, the thickness of the inter-electrode dielectric layer is slightly greater than or equal to the thickness of the gate oxide layer.

On the other hand, since the inter-electrode dielectric layer is usually formed by oxidizing the top portion of poly-Si (namely, the shielding electrode), the inter-electrode dielectric layer has lower density and withstand voltage than that of the gate oxide layer. Therefore, in the conventional trench power MOSFET, the withstand voltage between the gate and the shielding electrode is insufficient and a leakage current may be generated therebetween, thereby affecting the reliability of the component.

SUMMARY OF THE DISCLOSURE

In response to the above-referenced technical inadequacies, the present disclosure provides a trench power semiconductor component and a method of manufacturing the same to improve the insufficient withstand voltage between a gate and a shielding electrode, a leakage current therebetween, and the reliability of the component.

In one aspect, the present disclosure provides a method of manufacturing a trench power semiconductor component. The method includes: forming an epitaxial layer on a substrate; forming at least one trench in the epitaxial layer; and forming a trench gate structure in the trench. The step of forming the trench gate structure at least includes: forming a shielding electrode, a bottom insulating layer and an upper insulating layer in the trench, wherein the bottom insulating layer covers a lower part of an inner wall of the trench and surrounds the shielding electrode, and the upper insulating layer covers an upper part of the inner wall of the trench; forming an interlayer dielectric layer and a U-shaped masking layer in the trench, wherein the interlayer dielectric layer is disposed between the upper insulating layer and the U-shaped masking layer; and removing a portion of the upper insulating layer and a portion of the interlayer dielectric layer located in the upper half of the trench through the U-shaped masking layer to form an inter-electrode dielectric layer.

In one aspect, the present disclosure provides a trench power semiconductor component including a substrate, an epitaxial layer, and a trench gate structure. The epitaxial layer is disposed on the substrate and has a trench. The trench gate structure is disposed in the trench and includes: a shielding electrode, a bottom insulating layer, an inter-electrode dielectric layer, a gate insulating layer and a gate. The shielding electrode is disposed in the lower half of the trench. The bottom insulating layer covers a lower part of an inner wall and surrounds the shielding electrode. The inter-electrode dielectric layer is disposed on the shielding electrode and the bottom insulating layer. The inter-electrode dielectric layer is divided into a middle portion on the shielding electrode and a surrounding portion on the bottom insulating layer, both a top surface of the middle portion and a top surface of the surrounding portion are higher than a top end surface of the shielding electrode, and the top surface of the middle portion is non-coplanar with the top surface of the surrounding portion. The gate insulating layer covers an upper part of the inner wall of the trench. The gate is disposed in the upper half of the trench and isolated from the shielding electrode by the inter-electrode dielectric layer.

One of the beneficial effects of the present disclosure is that, with the technical solutions of "forming an interlayer dielectric layer and a U-shaped masking layer in the trench," "removing a portion of the upper insulating layer and a portion of the interlayer dielectric layer located in the upper half of the trench through the U-shaped masking layer to form an inter-electrode dielectric layer," and "the inter-electrode dielectric layer is divided into a middle portion on the shielding electrode and a surrounding portion on the bottom insulating layer, both a top surface of the middle portion and a top surface of the surrounding portion are higher than a top end surface of the shielding electrode, and the top surface of the middle portion is non-coplanar with the top surface of the surrounding portion," the trench power semiconductor component and the method of manufacturing the same provided by the present disclosure allow the inter-electrode dielectric layer to have a certain thickness and higher withstand voltage such that the leakage current between the gate and the shielding electrode can be reduced and the reliability of the component can be further improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
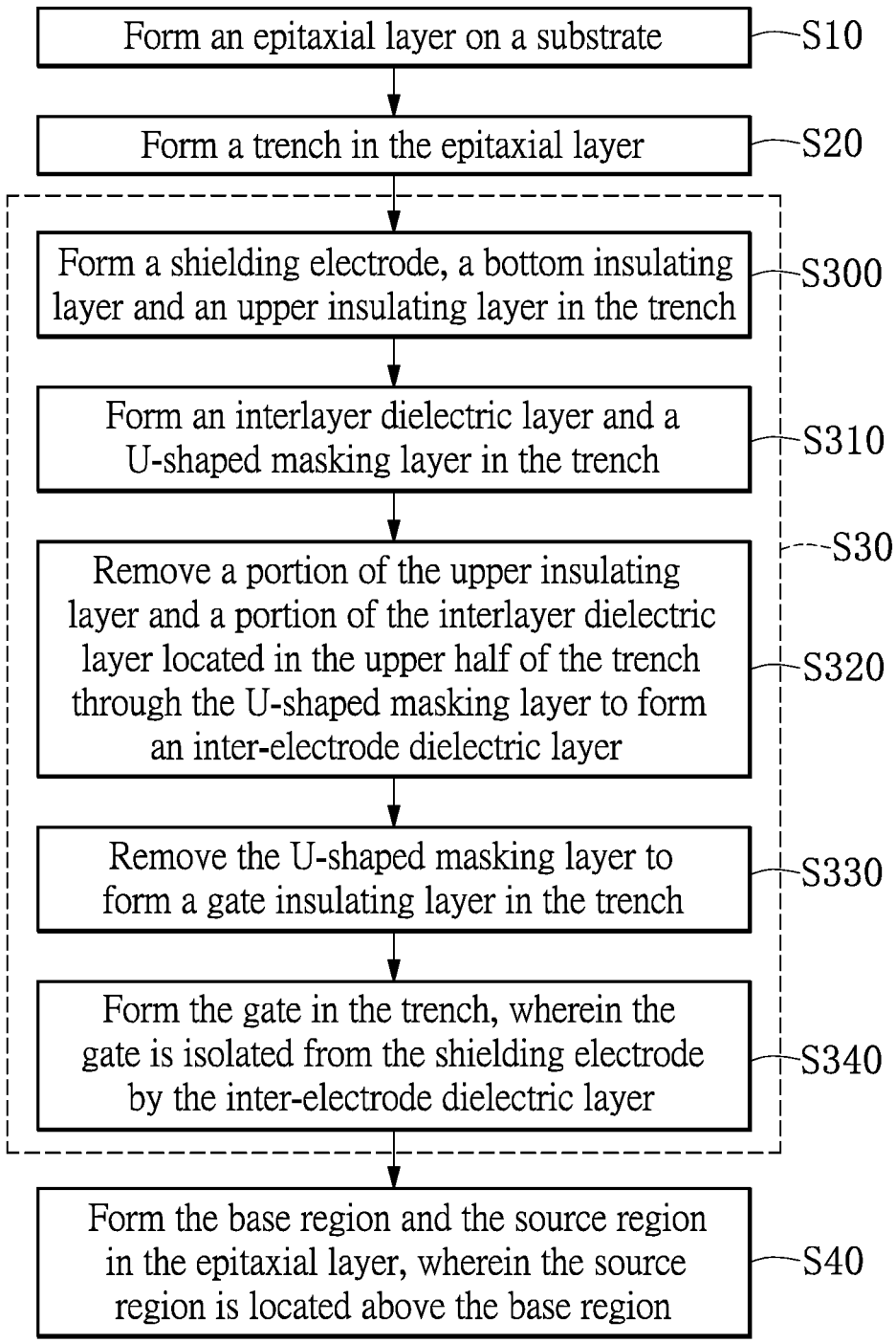
FIG. 1 is a flow chart of a method of manufacturing a trench power semiconductor component according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1, FIG. 1 shows a method of manufacturing a trench power semiconductor component according to an embodiment of the present disclosure.

In step S10, an epitaxial layer is formed on a substrate; in step S20, a trench is formed in the epitaxial layer; in step S30, a trench gate structure is formed in the trench; and in step S40, a base region and a source region are formed in the epitaxial layer and the source region is located above the base region. The method of manufacturing the trench power semiconductor component and steps of forming the trench gate structure are described as follows.

Figure 2:
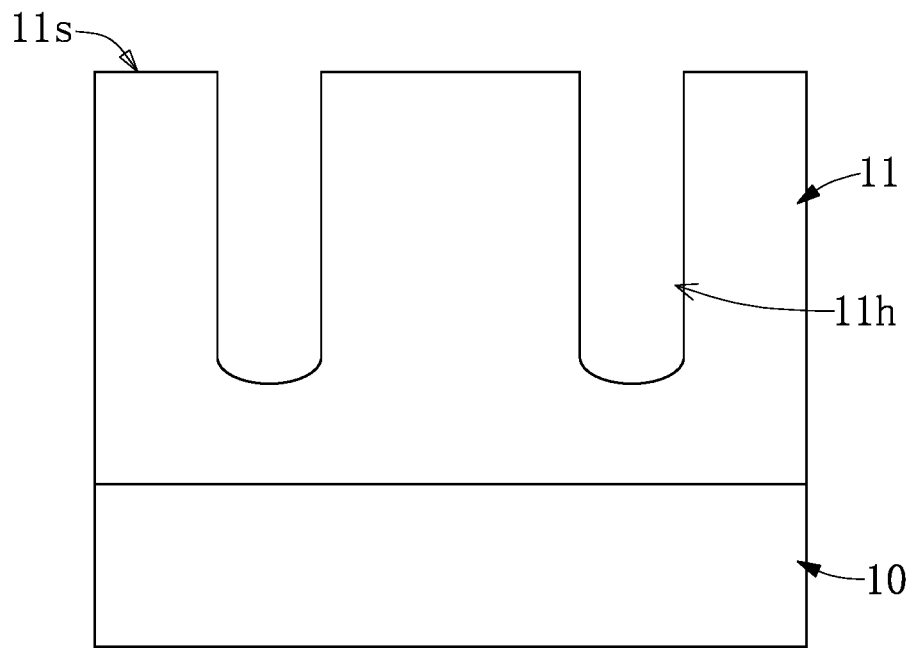
FIG. 2 is a schematic view of step S20 of the method according to an embodiment of the present disclosure.

FIG. 2 to FIG. 14 correspond to the flow chart of FIG. 1 to illustrate the steps of manufacturing the trench power semiconductor component according to the embodiment of the present disclosure. Referring to FIG. 2, an epitaxial layer 11 is formed on a substrate 10 and has the same conductivity type as the substrate 10, but a doping concentration of the epitaxial layer 11 is lower than a doping concentration of the substrate 10. The epitaxial layer 11 has an upper surface 11s opposite to the substrate 10.

In addition, a trench 11h is formed in the epitaxial layer 11 and extends toward the substrate 10 from the upper surface 11s. The number of trench 11h is not limited and in this embodiment two trenches 11h are illustrated as an example. The method proceeds to step S30, forming the trench gate structure in the trench, is performed, which will be described as follows.

Referring to FIG. 3 to FIG. 7 showing step S300 in FIG. 1, in step S300, a shielding electrode, a bottom insulating layer and an upper insulating layer are formed in the trench.

Figure 3:
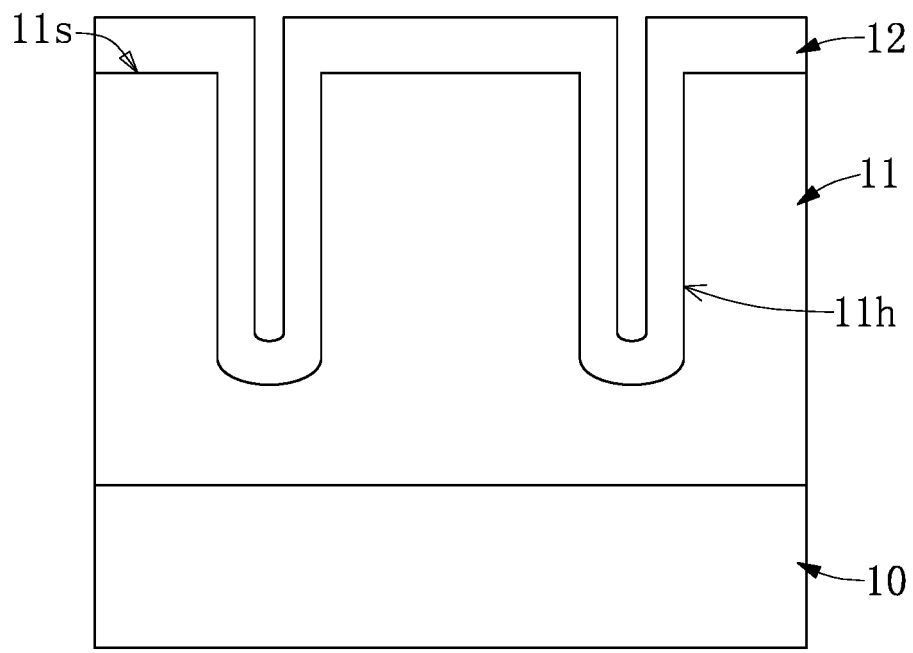
FIG. 3 to FIG. 7 are schematic views of step S300 of the method according to the embodiment of the present disclosure.

In FIG. 3, an initial insulating layer 12 is formed on an inner wall of the trench 11h, and the initial insulating layer 12 has a contour that conforms to the inner wall of the trench 11h. The initial insulating layer 12 covers the inner wall of the trench 11h and the upper surface 11s of the epitaxial layer 11. The initial insulating layer 12 can be a silicon oxide layer formed by known physical vapor deposition, chemical vapor deposition, or a thermal oxidation process.

Figure 4:
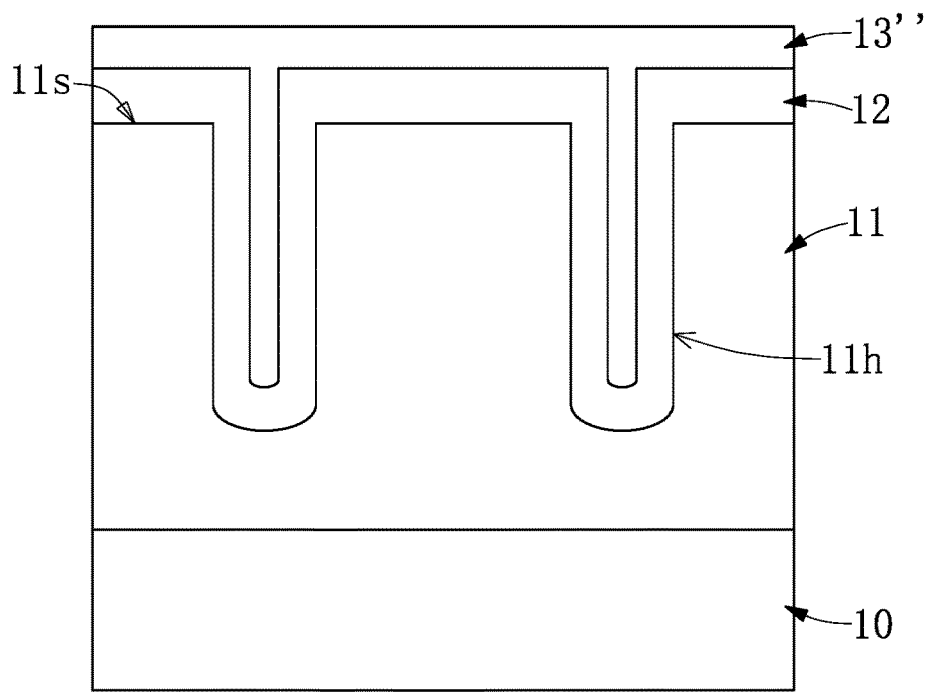
Figure 5:
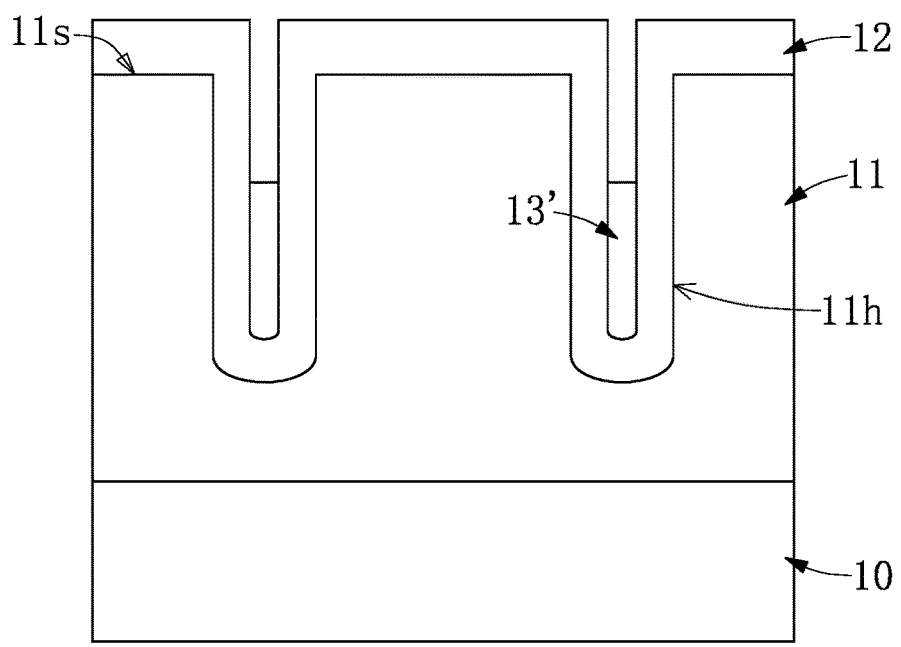

Referring to FIG. 4 and FIG. 5, an initial shielding electrode 13' is formed in the trench 11h. Specifically, in FIG. 4, a poly-Si layer 13" is completely formed on the epitaxial layer 11 and is filled in the trench 11h. Then, referring to FIG. 5, a portion of the poly-Si layer 13" covering on the upper surface 11s of the epitaxial layer 11 is removed by an etching back process, and the remaining poly-Si layer 13" located in the lower half of the trench 11h forms the initial shielding electrode 13'. The initial shielding electrode 13' can be a doped poly-Si structure containing conductive impurities.

Figure 6:
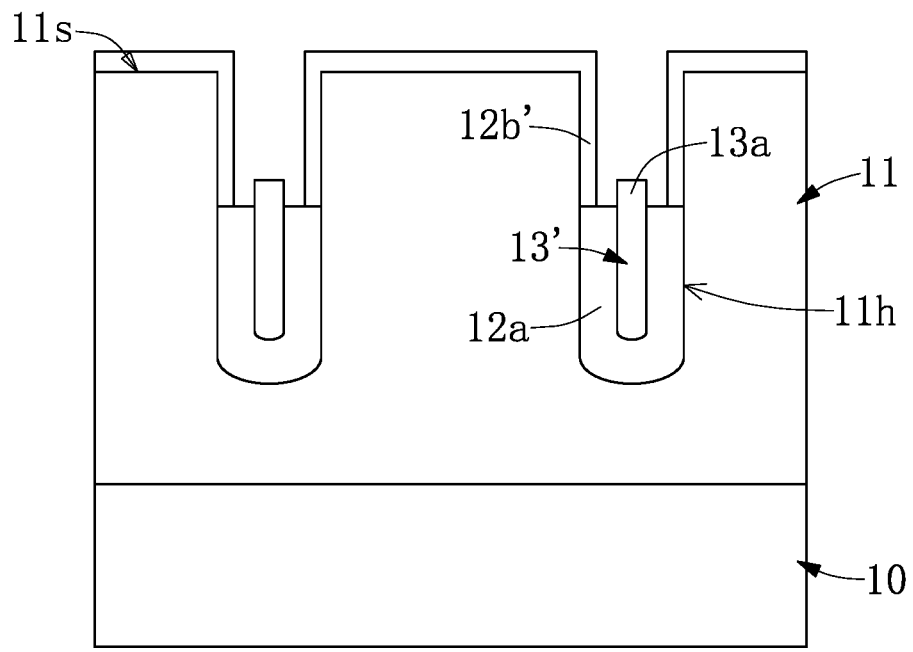

Referring to FIG. 6, a portion of initial insulating layer 12 located in the upper half of the trench 11h is removed by using the initial shielding electrode 13' as a mask. It should be noted that the initial insulating layer 12 located in the upper half of the trench 11h is not completely removed. Therefore, an upper insulating layer 12b' is formed in the upper half of the trench 11h and a bottom insulating layer 12a is formed in the lower half of the trench 11h. In other words, the upper insulating layer 12b' covers the upper part of the inner wall of the trench 11h and the bottom insulating layer 12a covers the lower part of the inner wall of the trench 11h. In addition, the thickness of the upper insulating layer 12b' is smaller than the thickness of the bottom insulating layer 12a, and a top portion 13a of the initial shielding electrode 13' protrudes from a top surface of the bottom insulating layer 12a.

Figure 7:
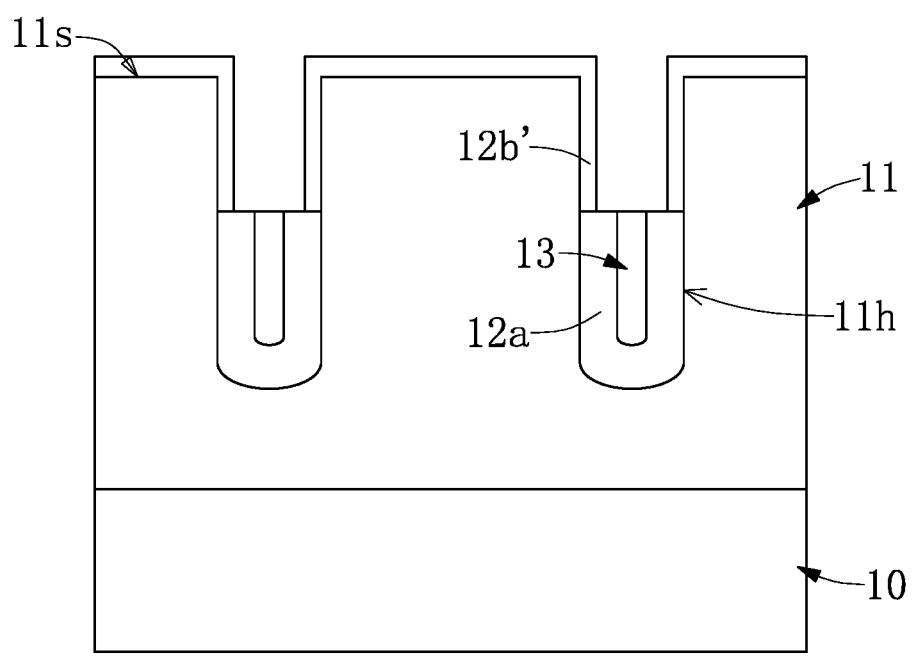

Referring to FIG. 7, the top portion 13a of the initial shielding electrode 13' is removed to form the shielding electrode 13. Further, a top end surface of the shielding electrode 13 is approximately flush with the top surface of the bottom insulating layer 12a. Moreover, the bottom insulating layer 12a surrounds the shielding electrode 13 to isolate the shielding electrode 13 from the epitaxial layer 11.

It should be noted that in this embodiment, the step of forming the shielding electrode 13 includes two etching steps. In addition, in this embodiment of the present disclosure, the inter-electrode dielectric layer is not formed by oxidizing the top portion of the shielding electrode 13. The step of forming the inter-electrode dielectric layer will be further explained below.

Figure 8:
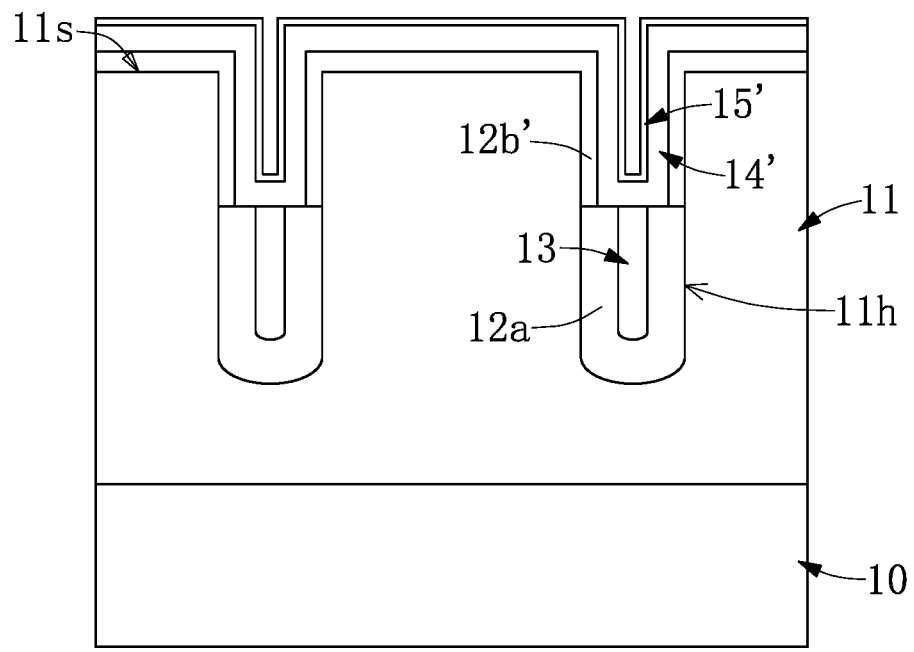
FIG. 8 to FIG. 9 are schematic views of step S310 of the method according to the embodiment of the present disclosure.
Figure 9:
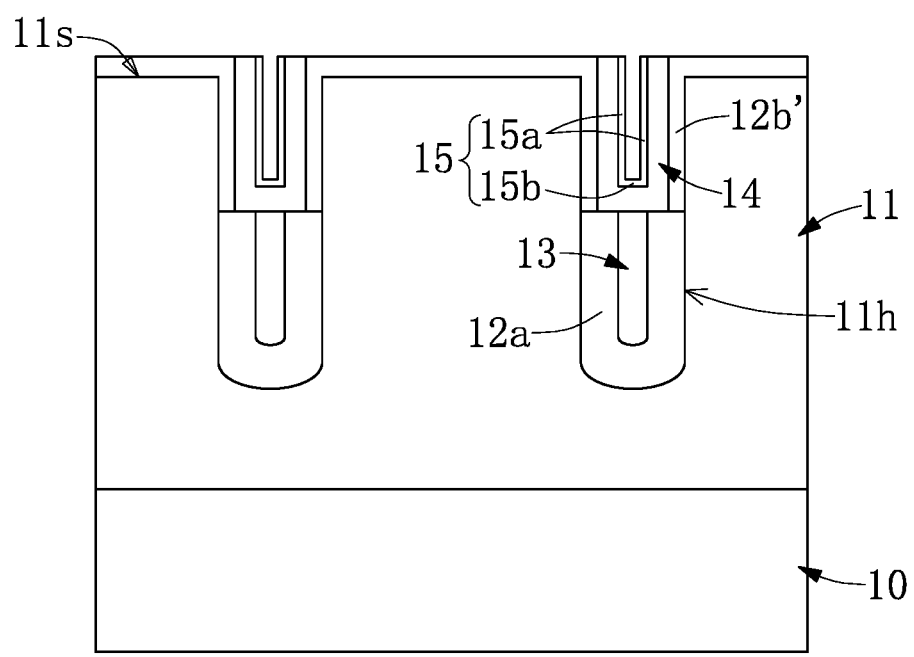

Referring to FIG. 8 and FIG. 9 showing the details of the step S310, in step S310, an interlayer dielectric layer and a U-shaped masking layer are formed in the trench. The interlayer dielectric layer is disposed between the upper insulating layer and the U-shaped masking layer.

In FIG. 8, an initial interlayer dielectric layer 14' covers the upper surface 11s of the epitaxial layer 11, the upper insulating layer 12b', the bottom insulating layer 12a and the shielding electrode 13. In one embodiment, the initial interlayer dielectric layer 14' is fabricated by chemical vapor deposition. Furthermore, the material of the initial interlayer dielectric layer 14' is the same as the materials of the upper insulating layer 12b' and the bottom insulating layer 12a, for example, silicon oxide.

It should be stated that in the present disclosure, the thickness of the initial interlayer dielectric layer 14' is determined according to the required thickness of the inter-electrode dielectric layer that will be formed in subsequent procedures. If the component is required to have higher withstand voltage, the initial interlayer dielectric layer 14' should be thicker. Furthermore, the initial interlayer dielectric layer 14' cannot be too thick to close an opening end of the trench 11h.

Referring to FIG. 8 again, after the initial interlayer dielectric layer 14' is formed, an initial masking layer 15' is formed to completely cover the initial interlayer dielectric layer 14'. Further, one portion of the initial masking layer 15' is located on the upper surface 11s of the epitaxial layer 11 and another portion thereof is located in the trench 11h. In this embodiment, the initial masking layer 15' is allowed to completely fill the remaining space of the trench 11h. In the instant embodiment, the initial masking layer 15 does not completely fill the remaining space.

In this embodiment, the material of the initial masking layer 15' is different from the materials of the initial interlayer dielectric layer 14' and the upper insulating layer 12b'. For instance, the material of the initial interlayer dielectric layer 14' is oxide, and the material of the initial masking layer 15' may be selected from nitride such as silicon nitride. However, the present disclosure is not limited thereto.

It should be noted that in the step of forming the initial interlayer dielectric layer 14', a position of a bottom portion of the initial masking layer 15' can be defined by controlling the thickness of the initial interlayer dielectric layer 14'.

Referring to FIG. 9, a portion of the initial interlayer dielectric layer 14' on the upper surface 11s of the epitaxial layer 11 and a portion of the initial masking layer 15' are removed, and the interlayer dielectric layer 14 and the U-shaped masking layer 15 are formed in the trench 11h. In one embodiment, a portion of the initial masking layer 15' and a portion of the initial interlayer dielectric layer 14' located on the upper surface 11s of the epitaxial layer 11 can be removed by chemical mechanical polishing.

After the above steps are performed, the U-shaped masking layer 15 can be formed in the trench 11h, and the top end of the U-shaped masking layer 15 is approximately flush with the top surface of the interlayer dielectric layer 14. Furthermore, the interlayer dielectric layer 14 is located between the U-shaped masking layer 15 and the upper insulating layer 12b'. In this embodiment, an insulating layer having a certain thickness is left on the upper surface 11s of the epitaxial layer 11 to avoid the epitaxial layer 11 to be damaged, but the present disclosure is not limited thereto.

Figure 10:
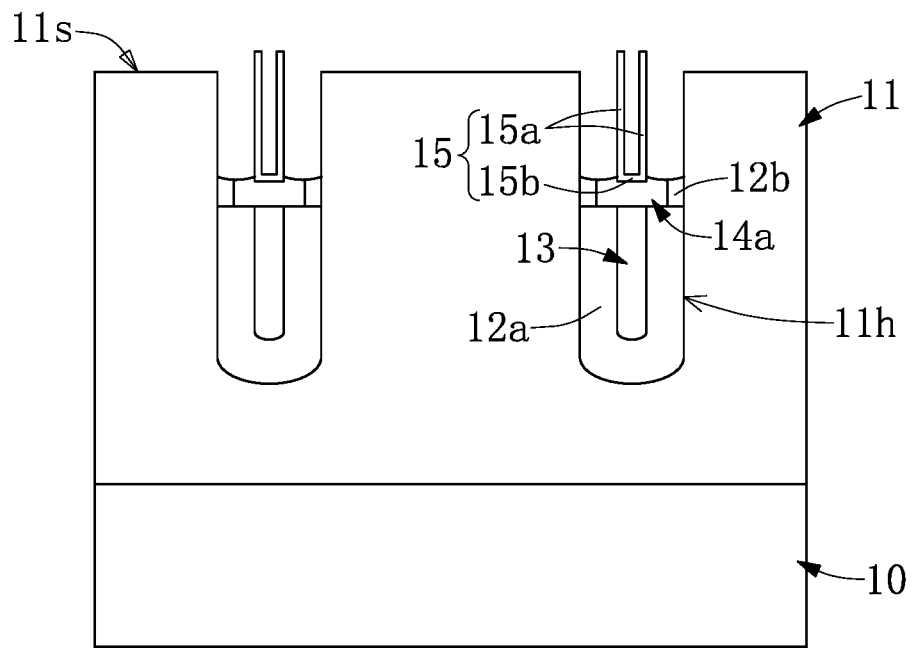
FIG. 10 is a schematic view of step S320 of the method according to the embodiment of the present disclosure.

Referring to FIG. 10 showing the details of the step S320 in FIG. 1, in step S320, a portion of the upper insulating layer and a portion of the interlayer dielectric layer located in the upper half of the trench are removed through the U-shaped masking layer to form an inter-electrode dielectric layer.

In FIG. 10, since the material of the U-shaped masking layer 15 is different from the materials of the upper insulating layer 12b' and the interlayer dielectric layer 14, the U-shaped masking layer 15 can be used as a cover during removing a portion of the upper insulating layer 12b' and a portion of the interlayer dielectric layer 14 located in the upper half of the trench 11h.

Further, selective wet etching can be performed to remove the upper insulating layer 12b' and the interlayer dielectric layer 14 located on the upper surface 11s of the epitaxial layer 11, and the upper insulating layer 12b' and the interlayer dielectric layer 14 located in the upper half of the trench 11h.

In FIG. 10, after the above steps are performed, the remaining part of the initial interlayer dielectric layer 14 forms an inter-electrode dielectric layer 14a. Furthermore, after etching of the upper insulating layer 12b', remaining portions 12b of the upper insulating layer 12b' forms two side portions which is arranged at two lateral opposite sides of the inter-electrode dielectric layer 14a, respectively. After a portion of the upper insulating layer 12b' and a portion of the initial interlayer dielectric layer 14 located in the upper half of the trench 11h are removed, the U-shaped masking layer 15 is left in the upper half of the trench 11h and the U-shaped masking layer 15 is located on a middle portion of the inter-electrode dielectric layer 14a.

In FIG. 10, the U-shaped masking layer 15 has two opposite side wall portions 15a and a bottom portion 15b connected between the two side wall portions 15a. In this embodiment, top ends of the two side wall portions 15a protrude from the upper surface 11s of the epitaxial layer 11.

According to the above, in this embodiment, the position of the bottom portion of the initial masking layer 15' is defined by controlling the thickness of the initial interlayer dielectric layer 14. As such, the bottom portion 15b of the U-shaped masking layer 15 is located directly above the shielding electrode 13.

It should be noted that since a portion of the interlayer dielectric layer 14 between the U-shaped masking layer 15 and the shielding electrode 13 is covered by the U-shaped masking layer 15, it can be retained after the selective etching is performed and maintain the same thickness as the initial interlayer dielectric layer 14'. Accordingly, the method provided by the present disclosure can ensure that the inter-electrode dielectric layer 14a between the shielding electrode 13 and the gate has a certain thickness and better withstand voltage. In one embodiment, a thickness of the middle portion of the inter-electrode dielectric layer 14a ranges from 50 to 300 nm.

Figure 11:
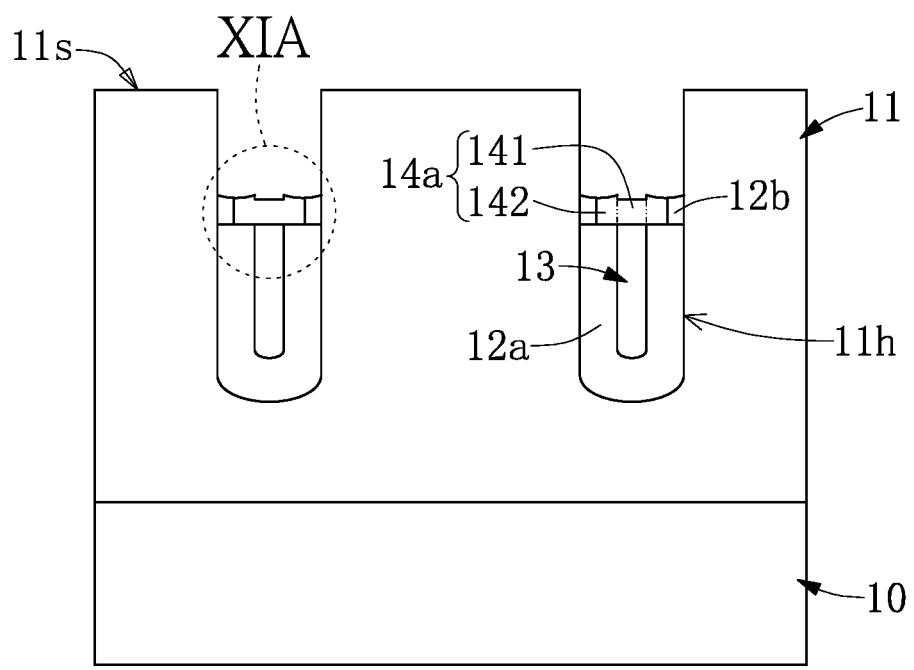
FIG. 11 is a schematic view of step S330 of the method according to the embodiment of the present disclosure.
Figure 11A:
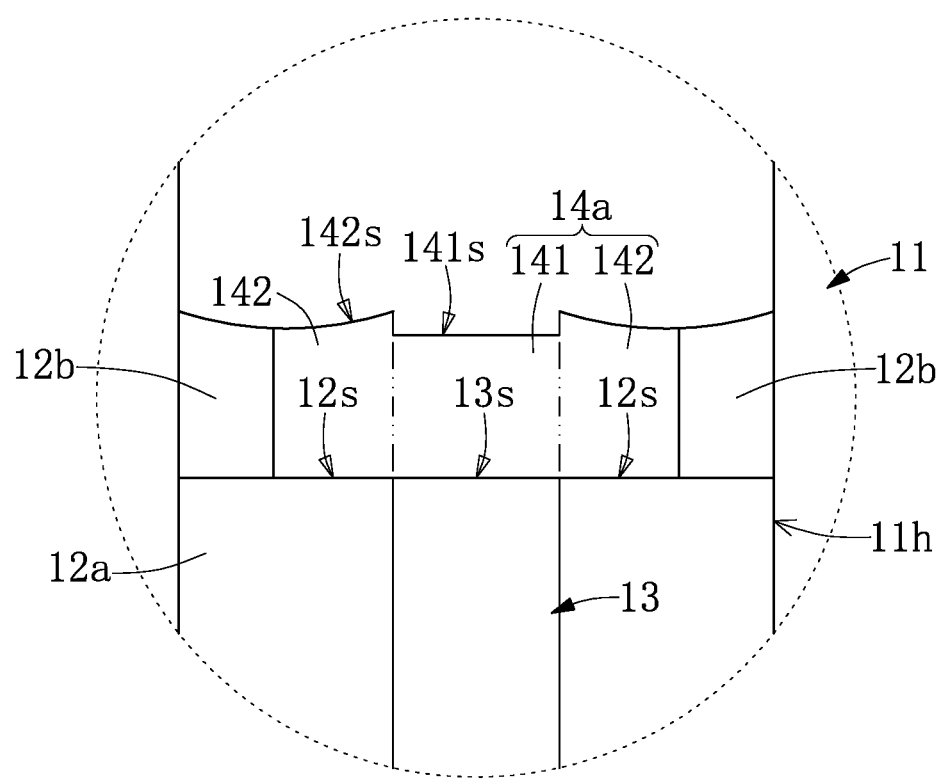
FIG. 11A is a partially enlarged view of region XIA of the trench power semiconductor component in FIG. 11 according to the embodiment of the present disclosure.
Figure 12:
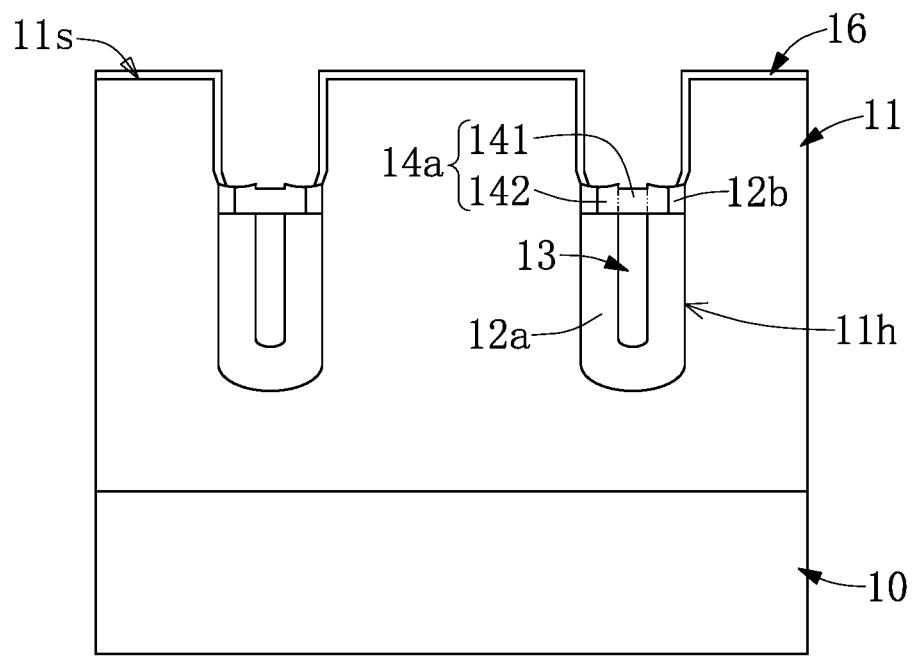
FIG. 12 is a schematic view of step S330 of the method according to the embodiment of the present disclosure.

Referring to FIG. 11, FIG. 11A and FIG. 12 showing the details of step S330 in FIG. 1, in step S330, the U-shaped masking layer is removed to form a gate insulating layer in the trench. The gate insulating layer covers the upper part of the inner wall of the trench.

In FIG. 11, the U-shaped masking layer 15 in the trench 11h is completely removed. Referring to FIG. 11 and FIG. 11A, the inter-electrode dielectric layer 14a formed by the above steps can be divided into a middle portion 14 1and a surrounding portion 142 on the bottom insulating layer 12a, and the surrounding portion 142 is located between the middle portion 141 and the side wall surfaces of the trench 11h.

In FIG. 11A, both a top surface 142s of the surrounding portion 142 and a top surface 141s of the middle portion 141 are higher than a top end surface 13s of the shielding electrode 13. Since in this embodiment, the top end surface 13s of the shielding electrode 13 is approximately flush with the top surface 12s of the bottom insulating layer 12a, the top surface 142s of the surrounding portion 142 and the top surface 141s of the middle portion 141 are higher than the top surface 12s of the bottom insulating layer 12a in position.

In addition, the top surface 141s of the middle portion 141 is non-coplanar with the top surface 142s of the surrounding portion 142. Further, in this embodiment, the surrounding portion 142 protrudes from the top surface 141s of the middle portion 141. As such, a decrease in withstand voltage or an increase in leakage current between the gate and the shielding electrode 13 due to the surrounding portion 142 being too thin can be avoided.

In FIG. 11A, since the surrounding portion 142 protrudes from the top surface 141s of the middle portion 141, the top surface 142s of the surrounding portion 142 and the top surface 141s of the middle portion 141 have a vertical distance therebetween, such that the inter-electrode dielectric layer 14a has two opposite stepped structures (not labeled).

Moreover, since in the step of forming the inter-electrode dielectric layer 14a, the U-shaped masking layer 15 is used as a cover, the top surface 141s of the middle portion 141 covered by the U-shaped masking layer 15 is a flat surface. Furthermore, two side portions 12b are arranged at two lateral opposite sides of the inter-electrode dielectric layer 14a, respectively.

Referring to FIG. 12, a gate insulating layer 16 is formed in the trench 11h, and covers the upper part of the inner wall of the trench 11h. In this embodiment, the gate insulating layer 16 is formed by thermal oxidation, so that after the gate insulating layer 16 is formed, the width of the upper half of the trench 11h is slightly larger than the width of the lower half of the trench 11h. Therefore, the bottom portion of the gate insulating layer 16 has an inclined plane extending from the upper part of the inner wall of the trench 11h to the top surface of one of the remaining portions 12b. That is, the inclined plane at the bottom portion of the gate insulating layer 16 is connected to the top surface of one of the remaining portions 12b.

Figure 13:
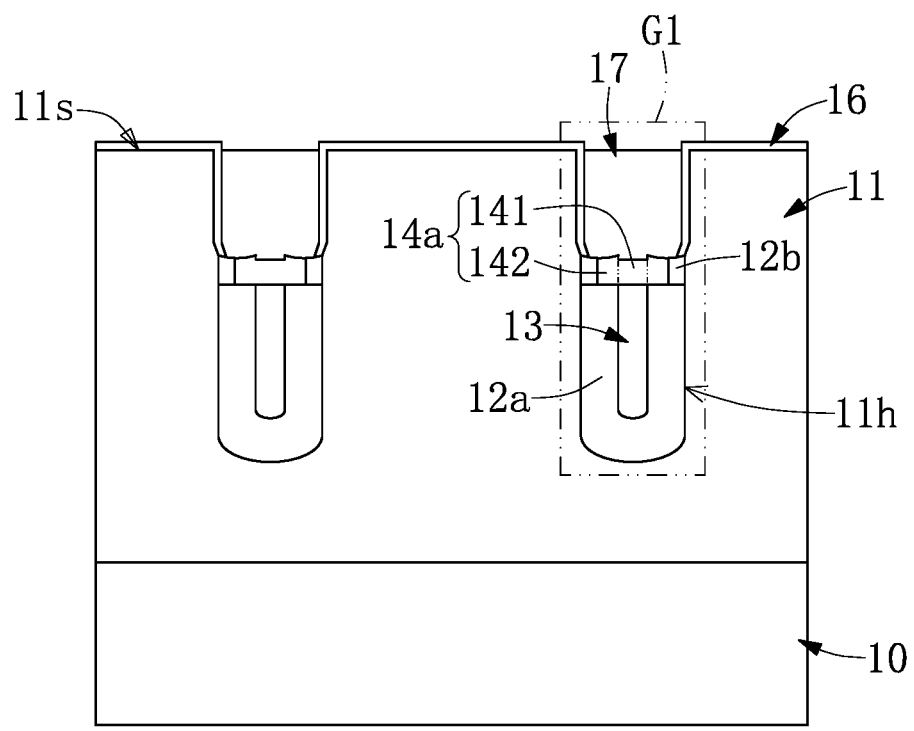
FIG. 13 is a schematic view of step S340 of the method according to the embodiment of the present disclosure.

FIG. 13 shows step S340 of the method according to the embodiment of the present disclosure. In step S340, the gate is formed in the trench and isolated from the shielding electrode by the inter-electrode dielectric layer.

In FIG. 13, a gate 17 is formed in the upper half of the trench 11h and isolated from the epitaxial layer 11 by the gate insulating layer 16. In addition, the gate 17 is isolated from the shielding electrode 13 by the inter-electrode dielectric layer 14a. In this embodiment, the gate 17 contacts the top surface 141s of the middle portion 141 of the inter-electrode dielectric layer 14a and the top surface 142s of the surrounding portion 142. That is, after the gate 17 is formed, the two stepped structures of the inter-electrode dielectric layer 14a directly contact the gate 17. By performing the steps in FIG. 3 to FIG. 13, a trench gate structure G1 of one of the embodiments of the present disclosure can be formed.

Figure 14:
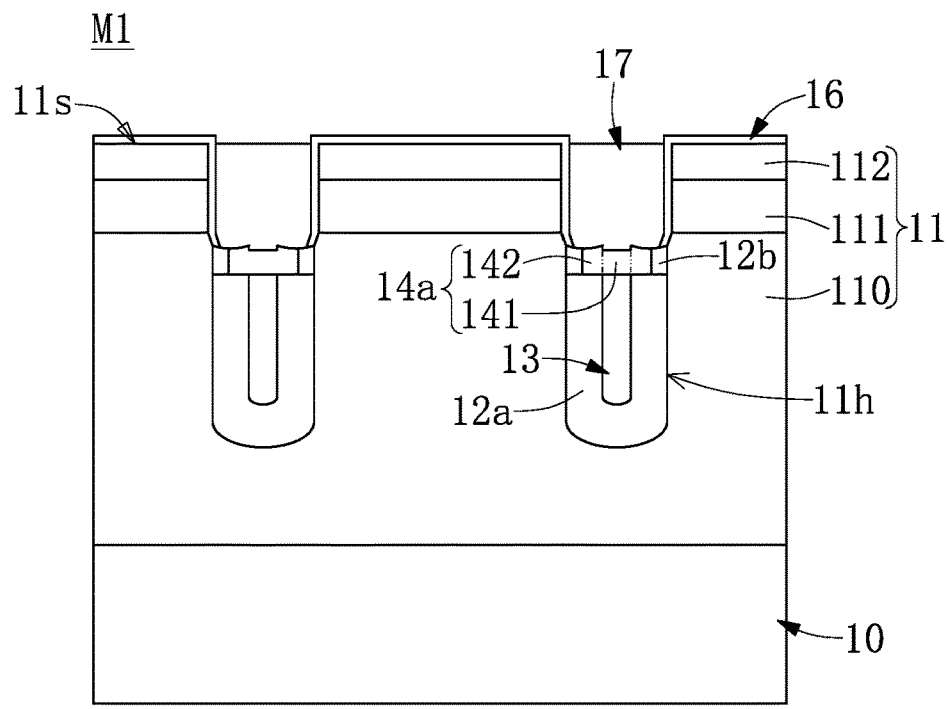
FIG. 14 is a schematic view of the trench power semiconductor component according to one of the embodiments of the present disclosure.

Referring to FIG. 1 again, in step S40, the base region and the source region are formed in the epitaxial layer and the source region is located above the base region. Referring to FIG. 14, FIG. 14 is a schematic view of the trench semiconductor component according to the embodiment of the present disclosure.

In FIG. 14, a base region 111 and a source region 112 are located in the epitaxial layer 11 and located at a side away from the substrate 10. The source region 112 is located above the base region 111 and connected to the upper surface 11s of the epitaxial layer 11. In one embodiment, the aforementioned base region 111 and the source region 112 can be formed by performing base doping and source doping. Furthermore, the lightly doped portion of the epitaxial layer 11, which is located under the base region 111, is defined as a drift region 110 of a trench power semiconductor component M1.

Based on the above, the trench power semiconductor component M1 of the embodiment of the present disclosure includes the substrate 10, the epitaxial layer 11 and the trench gate structure G1. The epitaxial layer 11 is disposed on the substrate 10 and has the trench 11h extending toward the substrate 10 from the upper surface 11s of the epitaxial layer 11. The epitaxial layer 11 can be divided into the drift region 110, the base region 111 and the source region 112.

The trench gate structure G1 is disposed in the trench 11h and includes: the shielding electrode 13, the bottom insulating layer 12a, the inter-electrode dielectric layer 14a, the gate insulating layer 16 and the gate 17. The shielding electrode 13 is disposed in the lower half of the trench 11h and the bottom insulating layer 12a covers the lower part of the inner wall of the trench 11h and surrounds the shielding electrode 13.

Both the top surface of the middle portion 141 and the top surface of the surrounding portion 142 are higher than the top end surface of the shielding electrode 13, but the top surface of the surrounding portion 142 is lower than a lower edge of the base region 111 in position.

In addition, the top surface of the middle portion 141 is non-coplanar with the top surface of the surrounding portion 142. In this embodiment, the surrounding portion 142 protrudes from the top surface of the middle portion 141. That is, the top surface of the surrounding portion 142 is higher than the top surface of the middle portion 141 in position, and a vertical distance is formed therebetween, such that the inter-electrode dielectric layer 14a has two opposite stepped structures contacting the gate 17.

In this embodiment, the top surface of the middle portion 141 is a flat surface. However, in other embodiments, the top surface of the middle portion 141 and the surface of the surrounding portion 142 can be flat surfaces according to different processes, which is not limited in the present disclosure.

Figure 15:
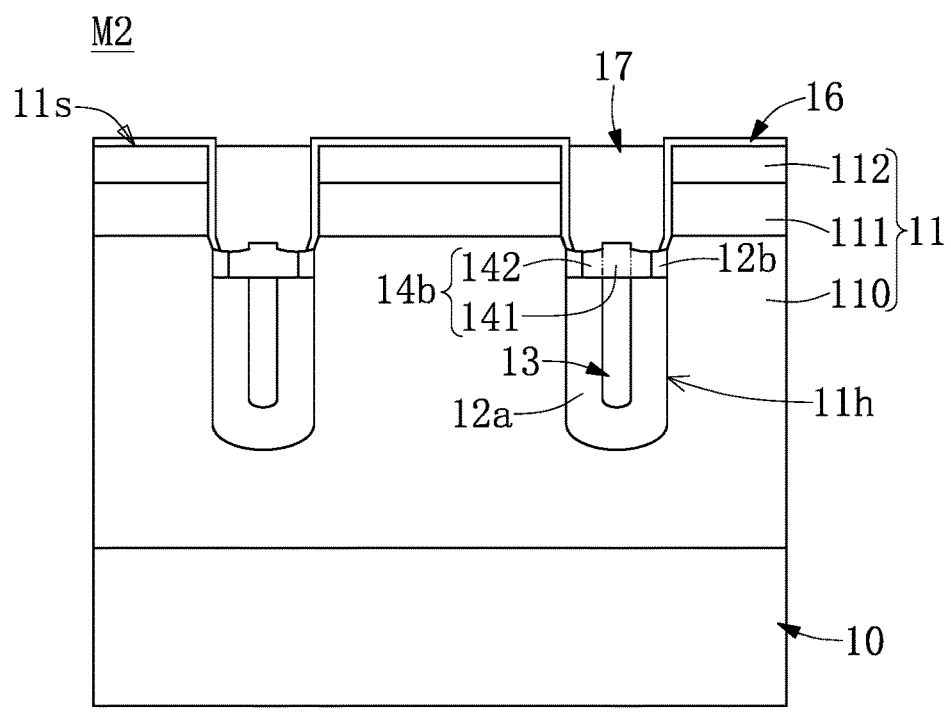
FIG. 15 is a schematic view of a trench power semiconductor component according to another embodiment of the present disclosure.

FIG. 15 is a schematic view of a trench power semiconductor component according to another embodiment of the present disclosure. A difference between a trench power semiconductor component M2 of the present disclosure and that in the embodiment shown in FIG. 14 is that the middle portion 141 of an inter-electrode dielectric layer 14b protrudes from the top surface of the surrounding portion 142. That is, the top surface of the middle portion 141 is higher than the top surface of the surrounding portion 142 in position and a vertical distance is formed therebetween, such that the inter-electrode dielectric layer 14b has two opposite stepped structures (not labeled) contacting the gate 17.

One of the beneficial effects of the present disclosure is that, with the technical solutions of "forming the interlayer dielectric layer 14 and the U-shaped masking layer 15 in the trench 11h," "removing a portion of the upper insulating layer 12b' and a portion of the interlayer dielectric layer 14 located in the upper half of the trench 11h through the U-shaped masking layer 15 to form the inter-electrode dielectric layers 14a or 14b," and "the inter-electrode dielectric layers 14a or 14b is divided into the middle portion 141 and the surrounding portion 142, both the top surface 141s of the middle portion 141 and the top surface 142s of the surrounding portion 142 are higher than the top end surface 13s of the shielding electrode 13, and the top surface 141s of the middle portion 141 is non-coplanar with the top surface 142s of the surrounding portion 142," the trench power semiconductor component and the method of manufacturing the same provided by the present disclosure allow the inter-electrode dielectric layers 14a and 14b to have a certain thickness and higher withstand voltage. On the other hand, the leakage current between the gate 17 and the shielding electrode 13 can be reduced and the reliability of the components M1 and M2 can be further improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method of manufacturing a trench power semiconductor component, comprising:
   forming an epitaxial layer on a substrate;
   forming at least one trench in the epitaxial layer; and
   forming a trench gate structure in the at least one trench, wherein the step of forming the at least one trench gate structure at least includes:
   forming a shielding electrode, a bottom insulating layer and an upper insulating layer in the at least one trench, wherein the bottom insulating layer covers a lower part of an inner wall of the at least one trench and surrounds the shielding electrode, and the upper insulating layer covers an upper part of the inner wall of the at least one trench;
   forming an interlayer dielectric layer and a U-shaped liner in the at least one trench, wherein the interlayer dielectric layer is disposed between the upper insulating layer and the U-shaped liner, the U-shaped liner has two side wall portions and a bottom portions connected between the two side wall portions, and the two side wall portions and the bottom portions jointly define a space therebetween;
   removing a portion of the upper insulating layer and a portion of the interlayer dielectric layer located in the upper half of the at least one trench through the U-shaped liner to form an inter-electrode dielectric layer; and
   completely removing the U-shaped liner.

2. The method according to claim 1, wherein the inter-electrode dielectric layer is divided into a middle portion on the shielding electrode and a surrounding portion on the bottom insulating layer, both a top surface of the middle portion and a top surface of the surrounding portion are higher than a top end surface of the shielding electrode, and the top surface of the middle portion is non-coplanar with the top surface of the surrounding portion.

3. The method according to claim 1, wherein the inter-electrode dielectric layer is divided into a middle portion and a surrounding portion, the surrounding portion protrudes from a top surface of the middle portion such that the inter-electrode dielectric layer has two opposite stepped structures and the two stepped structures contact a gate.

4. The method according to claim 1, wherein the inter-electrode dielectric layer is divided into a middle portion and a surrounding portion, the middle portion protrudes from a top surface of the surrounding portion such that the inter-electrode dielectric layer has two opposite stepped structures and the two stepped structures contact a gate.

5. The method according to claim 1, wherein the step of forming the shielding electrode, the bottom insulating layer and the upper insulating layer includes:
   forming an initial insulating layer in the at least one trench, wherein the initial insulating layer covers the inner wall of the at least one trench;
   forming an initial shielding electrode in the at least one trench, wherein the initial shielding electrode is located in the lower half of the at least one trench; and
   removing a portion of the initial insulating layer located in the upper half of the at least one trench by using the initial shielding electrode as a mask, to form the upper insulating layer and the bottom insulating layer.

6. The method according to claim 5, wherein a thickness of the upper insulating layer is smaller than a thickness of the bottom insulating layer, and a top portion of the initial shielding electrode protrudes from a top surface of the bottom insulating layer; wherein the step of forming the shielding electrode, the bottom insulating layer and the upper insulating layer further includes:
   removing the top portion of the initial shielding electrode to form the shielding electrode, wherein a top end surface of the shielding electrode is approximately flush with the top surface of the bottom insulating layer.

7. The method according to claim 1, wherein the step of forming the interlayer dielectric layer and the U-shaped liner in the at least one trench includes:
   forming an initial interlayer dielectric layer to cover an upper surface of the epitaxial layer, the upper insulating layer, the bottom insulating layer and the shielding electrode;
   forming an initial masking layer to cover the initial interlayer dielectric layer; and
   removing a portion of the initial interlayer dielectric layer and a portion of the initial masking layer located on the upper surface of the epitaxial layer to form the interlayer dielectric layer and the U-shaped liner.

8. The method according to claim 1, wherein top ends of the side wall portions protrude from an upper surface of the epitaxial layer.

9. The method according to claim 1, wherein in the step of forming the at least one trench gate structure, after the step of removing a portion of the upper insulating layer and a portion of the interlayer dielectric layer located in the upper half of the at least one trench, only the U-shaped liner remains in a space above the inter-electrode dielectric layer, and the U-shaped liner is located on a middle portion of the inter-electrode dielectric layer.

10. The method according to claim 1, wherein the step of forming the at least one trench gate structure further includes:
   after the step of completely removing the U-shaped liner, forming a gate insulating layer in the at least one trench, wherein the gate insulating layer covers the upper part of the inner wall of the at least one trench; and
   forming a gate in the at least one trench, wherein the gate is isolated from the shielding electrode by the inter-electrode dielectric layer.

11. A method of manufacturing a trench power semiconductor component, comprising:
   forming an epitaxial layer on a substrate;
   forming at least one trench in the epitaxial layer; and
   forming a trench gate structure in the at least one trench, wherein the step of forming the at least one trench gate structure at least includes:
      forming a shielding electrode, a bottom insulating layer and an upper insulating layer in the at least one trench, wherein the bottom insulating layer covers a lower part of an inner wall of the at least one trench and surrounds the shielding electrode, and the upper insulating layer covers an upper part of the inner wall of the at least one trench;
      forming an interlayer dielectric layer and a U-shaped liner in the at least one trench, wherein the interlayer dielectric layer is disposed between the upper insulating layer and the U-shaped liner, and the U-shaped liner has two side wall portions and a bottom portions connected between the two side wall portions, and the two side wall portions each have a thickness less than a thickness of the interlayer dielectric layer;
      removing a portion of the upper insulating layer and a portion of the interlayer dielectric layer located in the upper half of the at least one trench through the U-shaped liner to form an inter-electrode dielectric layer; and
      completely removing the U-shaped liner.

* * * * *